United States Patent
Okada

(10) Patent No.: US 6,649,949 B2
(45) Date of Patent: Nov. 18, 2003

(54) PHOTODIODE WITH ELECTRODE FOR NOISE IMMUNITY

(75) Inventor: Seigo Okada, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/177,763

(22) Filed: Jun. 24, 2002

(65) Prior Publication Data

US 2002/0195629 A1 Dec. 26, 2002

(30) Foreign Application Priority Data

Jun. 25, 2001 (JP) ........................... 2001-191488

(51) Int. Cl.[7] ................. H01L 31/113; H01L 31/062
(52) U.S. Cl. ................ 257/292; 257/290; 257/81; 257/233
(58) Field of Search .................. 257/431, 79, 350, 257/458, 233, 446, 53, 184, 229, 436, 448, 452, 457, 459, 461, 466, 292, 290, 81; 438/66, 326, 328

(56) References Cited

U.S. PATENT DOCUMENTS 6,118,165 A * 9/2000 Yano ........................ 257/436

FOREIGN PATENT DOCUMENTS

JP 11-298033 A 10/1999

* cited by examiner

Primary Examiner—Nathan J. Flynn
Assistant Examiner—Tan Tran
(74) Attorney, Agent, or Firm—Nixon & Vanderhye, P.C.

(57) ABSTRACT

A photodiode includes a high-concentration first conductivity-type substrate, a low-concentration first conductivity-type epitaxial layer formed on one face of the substrate, a second conductivity-type diffusion layer formed in the epitaxial layer, the diffusion layer serving as a light-receptive section, a pair of electrodes comprising a cathode and an anode, one of the pair of electrodes being mounted on the second conductivity-type diffusion layer and the other being mounted on another face of the substrate or one of the pair of electrodes being mounted on the second conductivity-type diffusion layer and the other being mounted on the epitaxial layer except the diffusion layer, and a third electrode mounted in an outer periphery or an inner periphery of a region occupied by the second conductivity-type diffusion layer on the epitaxial layer, the third electrode not contacting the pair of electrodes.

13 Claims, 7 Drawing Sheets

PHOTODIODE WITH ELECTRODE FOR NOISE IMMUNITY

CROSS-REFERENCE TO RELATED APPLICATION

This application is related to Japanese Patent Application No. 2001-191488 filed on Jun. 25, 2001, whose priority is claimed under 35 USC §119, the disclosure of which is incorporated by reference in its entirety.

BACKGROUND OF THE INVENTION

1. Field of the Invention

The present invention relates to a photodiode, more particularly, to a structure of a photodiode suitable for manufacture of an IrDA communication receiver which operates at high speed and exhibits good noise immunity.

2. Description of Related Art

The IrDA communication (Infrared Data Association communication, or infrared wireless data communication) is a useful data communication method used between computers, computer peripherals, mobile phones, electronic keys and the like. Receivers used with such equipment are required to have quick-response and be immune to electromagnetic noise generated from computers and other equipment.

In a prior-art photodiode for the IrDA communication, as shown in a plan view of FIG. 10 and a sectional view of FIG. 11, an $N^-$ epitaxial layer 2 is formed on an $N^+$-type substrate 1, and a P-type diffusion layer 3 to be a light-receptive section of the photodiode is formed on the N epitaxial layer 2. An N-type diffusion layer 4 is formed as a channel stopper to surround the P-type diffusion layer 3. The surface of a chip is covered with an oxide film 5. A contact hole is formed in a part of the oxide film, and an Al electrode 6 to be an anode is formed at the contact hole. An Au electrode 9 to be a cathode is formed on a back surface of the chip. Since the IrDA communication is used for receiving data from a distance ranging from several tens of centimeters to several meters, the level of signals varies greatly. In addition to that, the electromagnetic noise from computer equipment often causes mis-operation of the photodiode having the prior-art structure.

In accordance with Japanese Unexamined Patent Publication No. HEI 11(1999)-298033, in a photodiode in which diffusions are distributed on a surface of a chip, a dummy electrode is provided to oppose an electrode connecting the diffusions, and a signal from the distributed photodiode and a signal from the dummy electrode are cancelled by a differential amplifier.

In a photodiode of this structure, as shown in a plan view of FIG. 12 and a sectional view of FIG. 13, a $P^-$ epitaxial layer 2A is formed on a $P^+$-type substrate 1A. N-type diffusion layers 3A to be light-receptive sections of the photodiode are formed in the form of a plurality of islands on the epitaxial layer. The island-form light-receptive sections are connected by Al wiring lines 6A which are cathodes, the Al wiring lines 6A forming a comb-like configuration. Other Al wiring lines 7 are provided as dummy electrodes between the Al wiring lines 6A in such a manner that the Al wiring lines 7 are opposed to the Al wiring lines 6A. The Al wiring lines 7 as the dummy electrodes are electrically insulated from anodes and cathodes. If noise comes from outside, the cathodes 6A and the dummy electrodes 7 pick up the same noise. The noise is removed by inputting signals from the cathodes 6A and the dummy electrodes 7 to a differential amplifier such as an IC connected to the photodiode. An Au electrode 9 is mounted on a back surface of the photodiode. The noise immunity is improved by setting the potential of the Au electrode to ground potential.

However, in the prior-art photodiode with improved noise immunity, because the surface of the chip is covered with the two types of opposing Al electrodes, a light-receiving area decreases and signal components weaken if the chip size is the same, which results in a decrease in SN ratio. This decrease has an adverse effect on the improvement of the noise immunity. Furthermore, in the case of the IrDA communication, light is incident to the entire chip and it takes some time for photoelectric current generated in the periphery of the chip to reach the light-receptive section, which results in a delay in response.

SUMMARY OF THE INVENTION

The present invention provides a photodiode including a high-concentration first conductivity-type substrate; a low-concentration first conductivity-type epitaxial layer formed on one face of the substrate; a second conductivity-type diffusion layer formed in the epitaxial layer, the second conductivity-type diffusion layer serving as a light-receptive section; a pair of electrodes comprising a cathode and an anode, one of the pair of electrodes being mounted on the second conductivity-type diffusion layer and the other being mounted on another face of the substrate or one of the pair of electrodes being mounted on the second conductivity-type diffusion layer and the other being mounted on the epitaxial layer except the second conductivity-type diffusion layer; and a third electrode mounted in an outer periphery or an inner periphery of a region occupied by the diffusion layer on the epitaxial layer, the third electrode not contacting the pair of electrodes.

In the present invention, the third electrode is electrically insulated from the anode and the cathode. The third electrode is formed proximate the periphery of the photodiode, that is, on the low-concentration first conductivity-type epitaxial layer and in the outer periphery or the inner periphery of the region forming the second conductivity type diffusion layer, preferably in such a manner that the third electrode covers the periphery of the photodiode light-shieldingly.

The third electrode may be formed by the same process as usually used for forming electrodes such as anodes and cathodes in the field of art. In the present invention, for light shielding over the periphery of the photodiode, a metal such as Al, Cu, an alloy of Cu with Al, a laminate of Al and Cu may be used in a specific thickness, for example, 1 to 3 $\mu$m in the case of Al.

According to the present invention, a photodiode can be provided which operates at high speed, has good noise immunity and does not mis-operate even in communications across a distance ranging from several tens of centimeters to several meters because the third electrode (a dummy electrode) is disposed proximate the periphery of the photodiode in a light-shielding manner.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Embodiments of photodiodes according to the present invention are now described with reference to the attached drawings. These embodiments, however, should not be construed to limit the scope of the invention.

Embodiment 1

Figure 1:
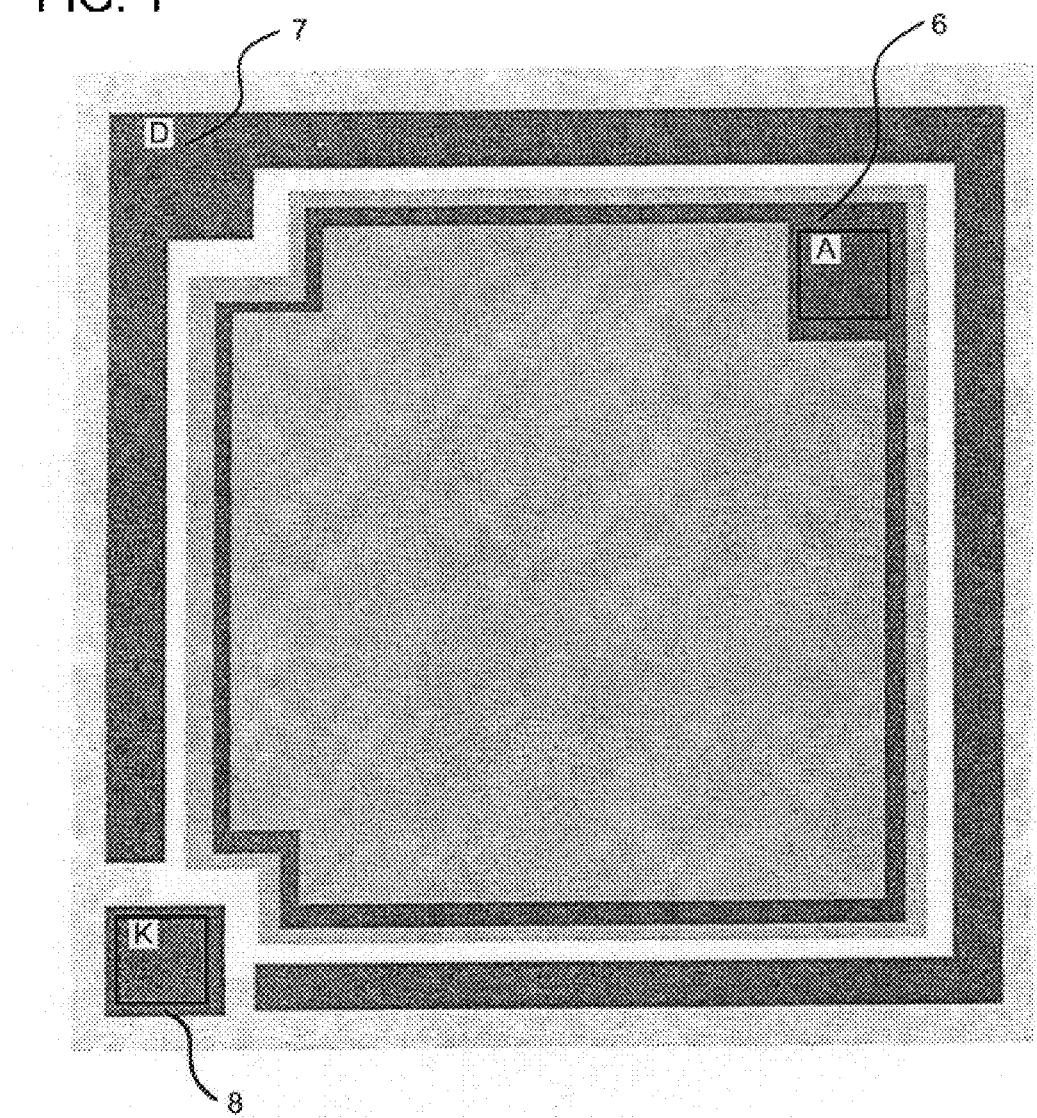
FIG. 1 is a plan view illustrating the structure of a photodiode in accordance with Embodiment 1 of the present invention.
Figure 2:
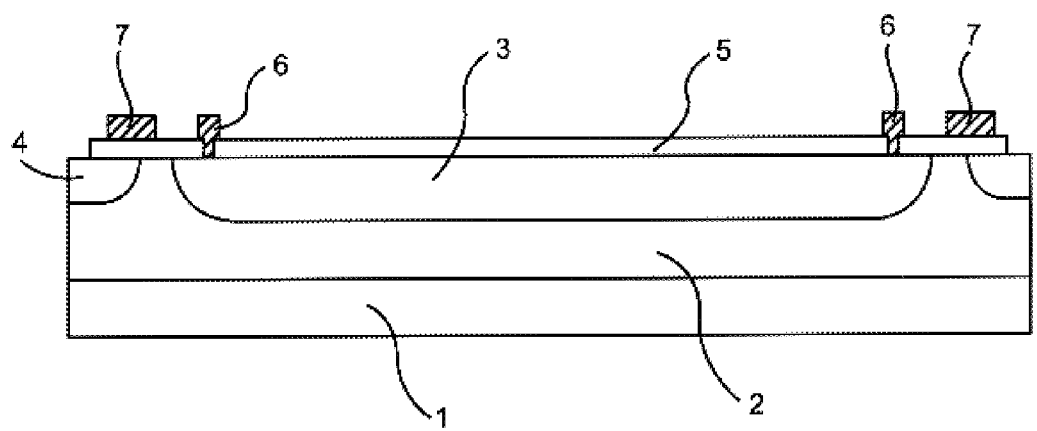
FIG. 2 is a sectional view of FIG. 1.

FIG. 1 is a plan view illustrating the structure of a photodiode in accordance with Embodiment 1 of the present invention, and FIG. 2 is a sectional view of FIG. 1.

In FIGS. 1 and 2, a photodiode P1 is provided with a high-concentration N$^+$-type substrate 1 (also referred to as a first substrate hereinafter) as a high-concentration first conductivity-type substrate; a low-concentration N$^-$-type epitaxial layer 2 formed as a low-concentration first conductivity-type epitaxial layer on an upper face of the substrate 1; a P-type diffusion layer 3 formed in the epitaxial layer 2 as a second conductivity-type diffusion layer which serves as a light-receptive section; and an N-type diffusion layer 4 formed outside the P-type diffusion layer 3, i.e., in an inner periphery of the epitaxial layer 2.

The above-mentioned structure may be built by forming the low-concentration N$^-$-type epitaxial layer 2 on the high-concentration N$^+$-type substrate 1, forming a boron diffusion layer 3 by P-type diffusion in the epitaxial layer 2, diffusing phosphorus outside the P-type diffusion layer 3 to form the N-type diffusion layer 4 as a channel stopper.

The surface of a chip (photodiode P1) of the above-described structure is covered with an oxide film 5, and an anode 6 and a cathode 8 are formed of aluminum on the oxide film 5.

A dummy electrode 7 is formed proximate a periphery of the chip. In particular the dummy electrode 7 is formed over a region of the epitaxial layer 2 which boarders the N-type diffusion layer 4. The dummy electrode 7 is formed in an essentially concentric manner with a perimeter of the P-type diffusion layer 3. The dummy electrode 7 is electrically insulated from the anode 6 and the cathode 8.

The dummy electrode 7 may be formed simultaneously with the anode electrode 6 and the cathode electrode 8 by forming a layer of aluminum, a conductive material, on the oxide film 5 by sputtering or the like, patterning the aluminum layer into a desired configuration by wet-etching using phosphoric acid or other Al etchant.

Figure 9:
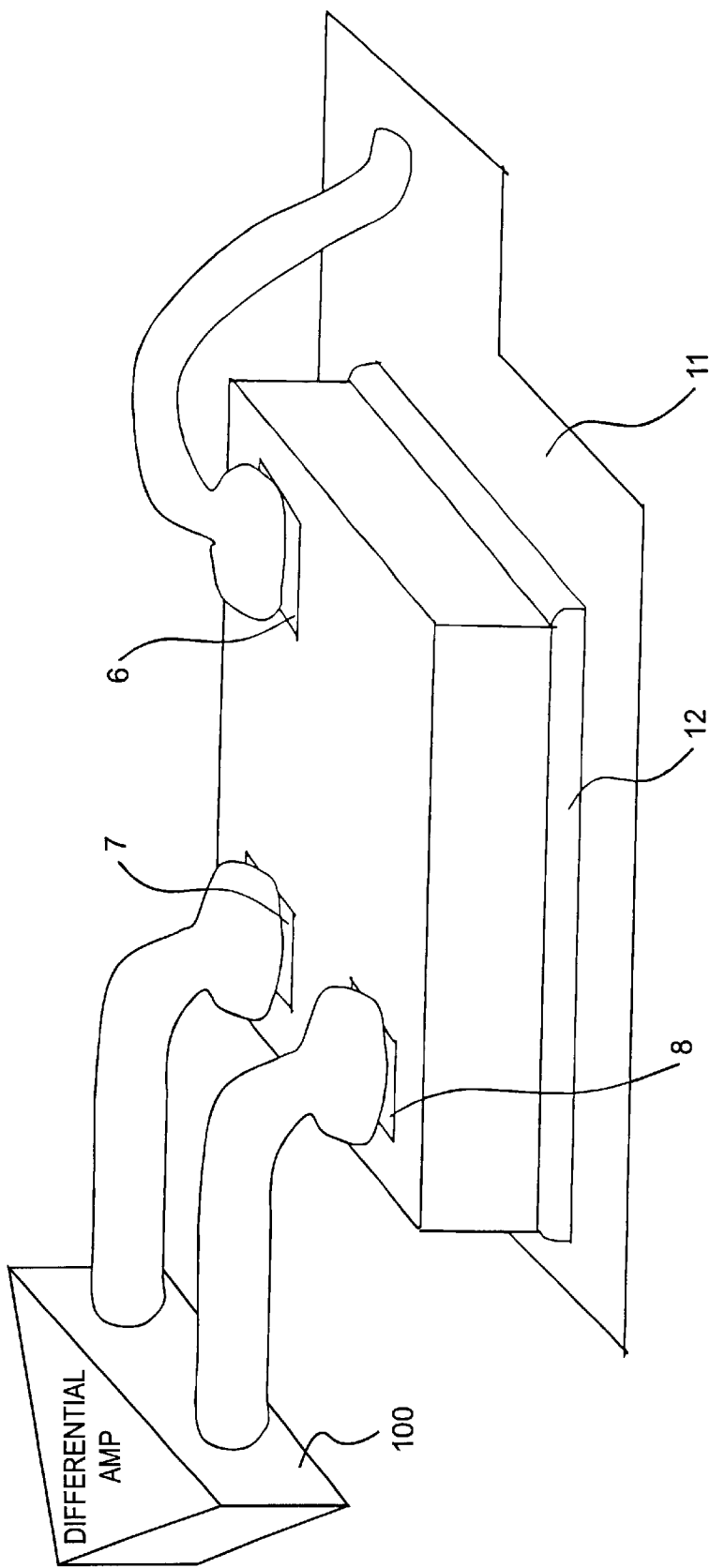
FIG. 9 illustrates the photodiode of FIG. 1 in an assembly.
Figure 10:
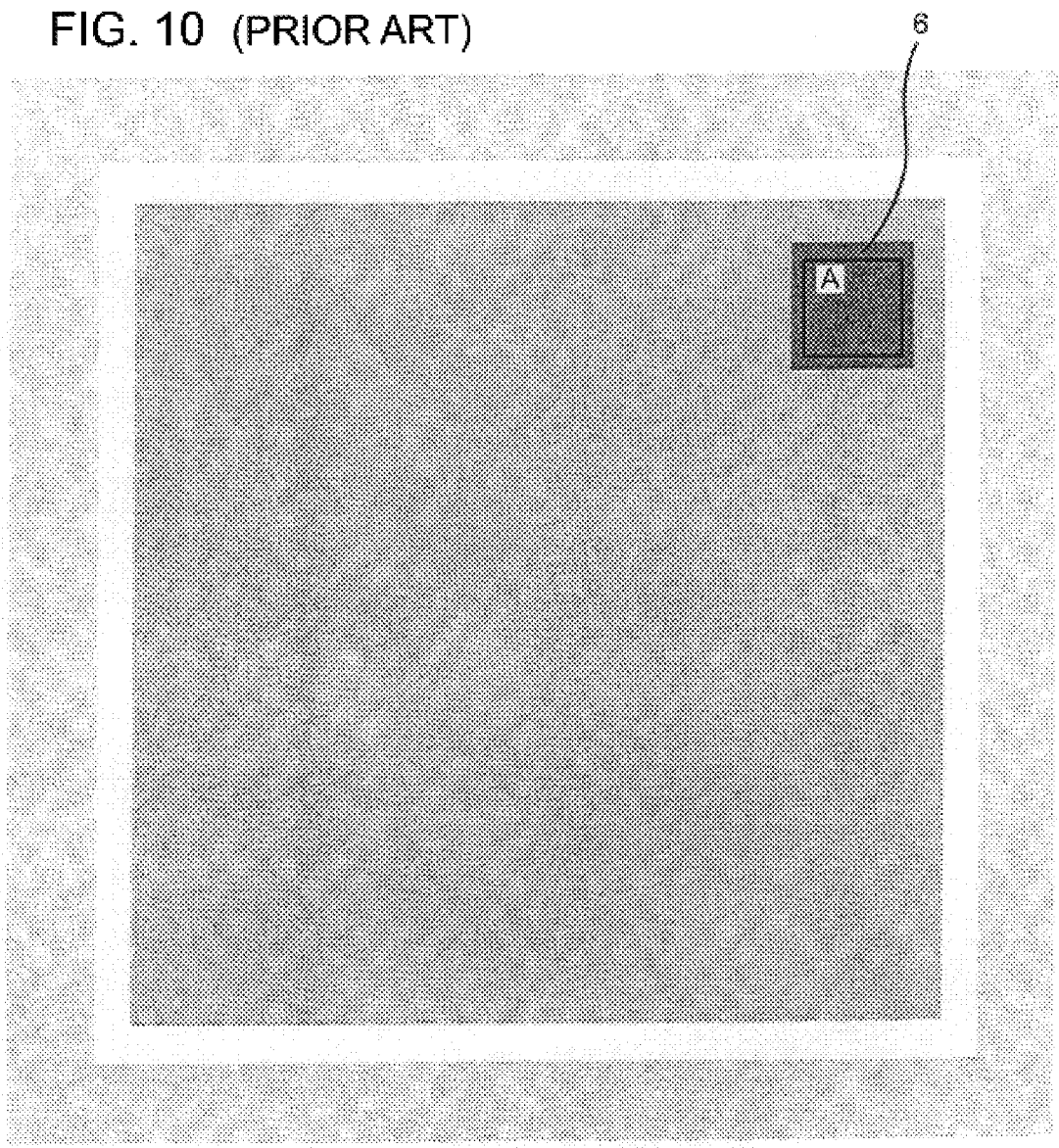
FIG. 10 shows a prior-art photodiode, corresponding to FIG. 1.
Figure 11:
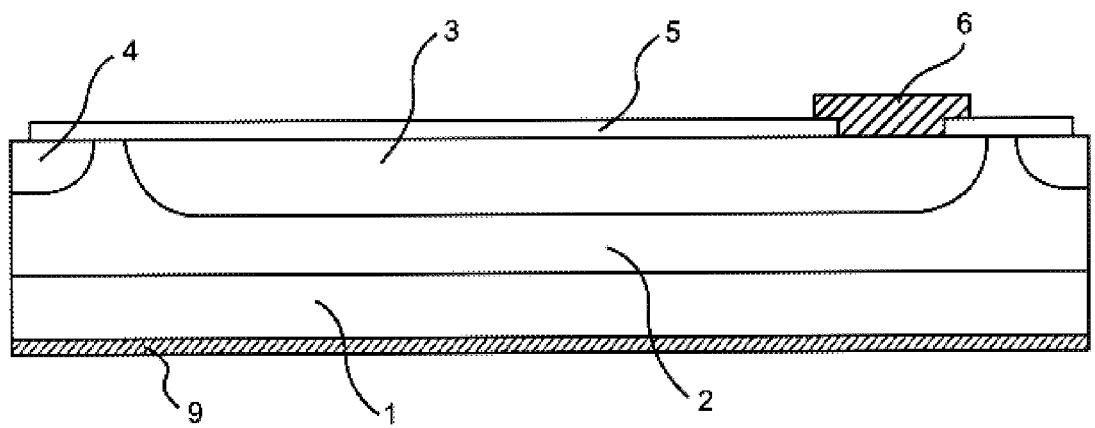
FIG. 11 shows the prior-art photodiode of FIG. 10, corresponding to FIG. 2.
Figure 12:
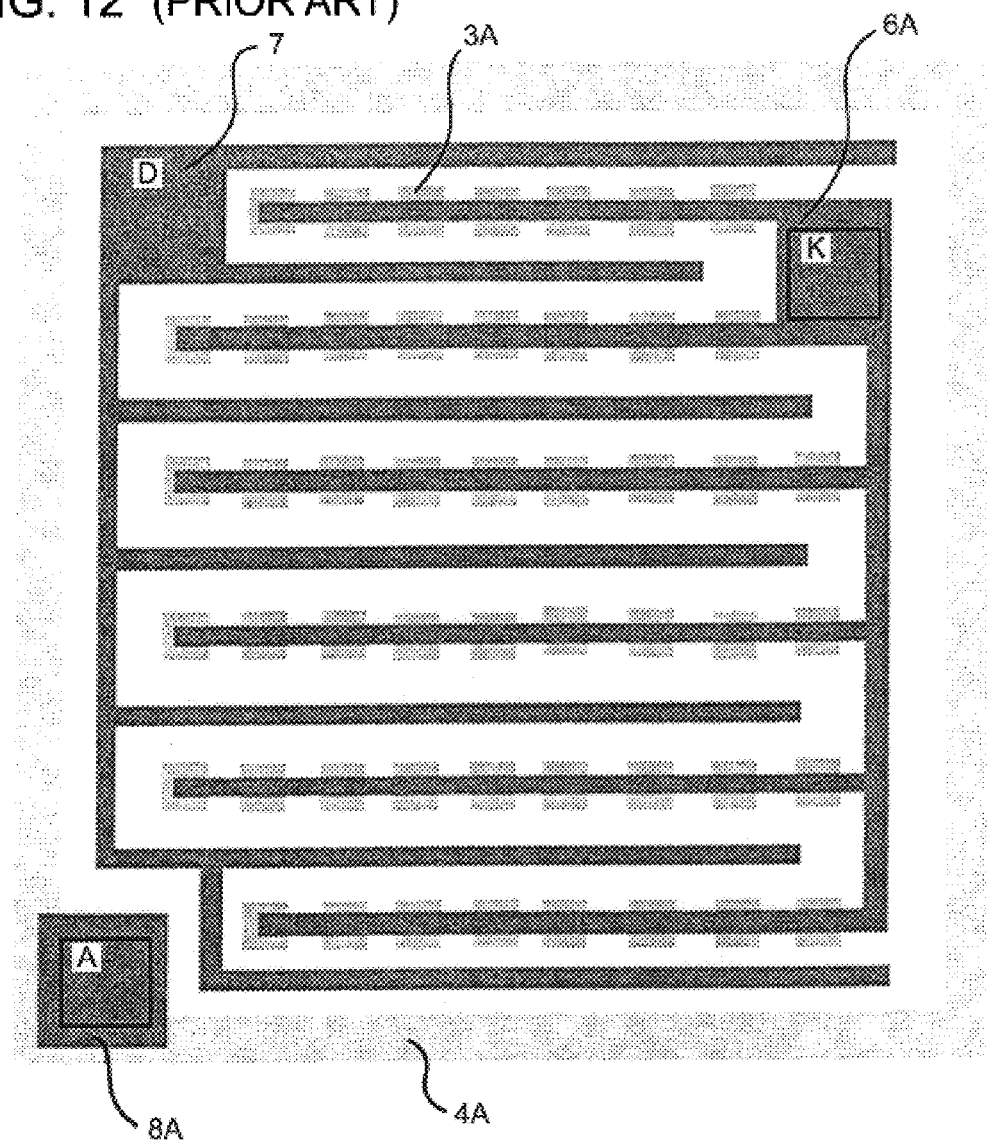
FIG. 12 shows another prior-art photodiode, corresponding to FIG. 1.

As shown in FIG. 9, the obtained photodiode P1 is die-bonded to another substrate 11 (referred to as a second substrate hereinafter) with an insulative paste 12. The anode 6 is wire-bonded to the second substrate 11. The potential of the second substrate 11 and the anode 6 is grounded. The cathode 8 and the dummy electrode 7 are wire-bonded to an input of a differential amplifier 100. Noise enters the cathode 8 and the dummy electrode 7 from parallel wires as antennae. The noise is cancelled by the differential amplifier. Also the epitaxial layer 2 in which photoelectric current is generated is protected by the grounded P-type diffusion layer 3 and second substrate 11. Thus the photodiode P1 has improved noise immunity.

Figure 3:
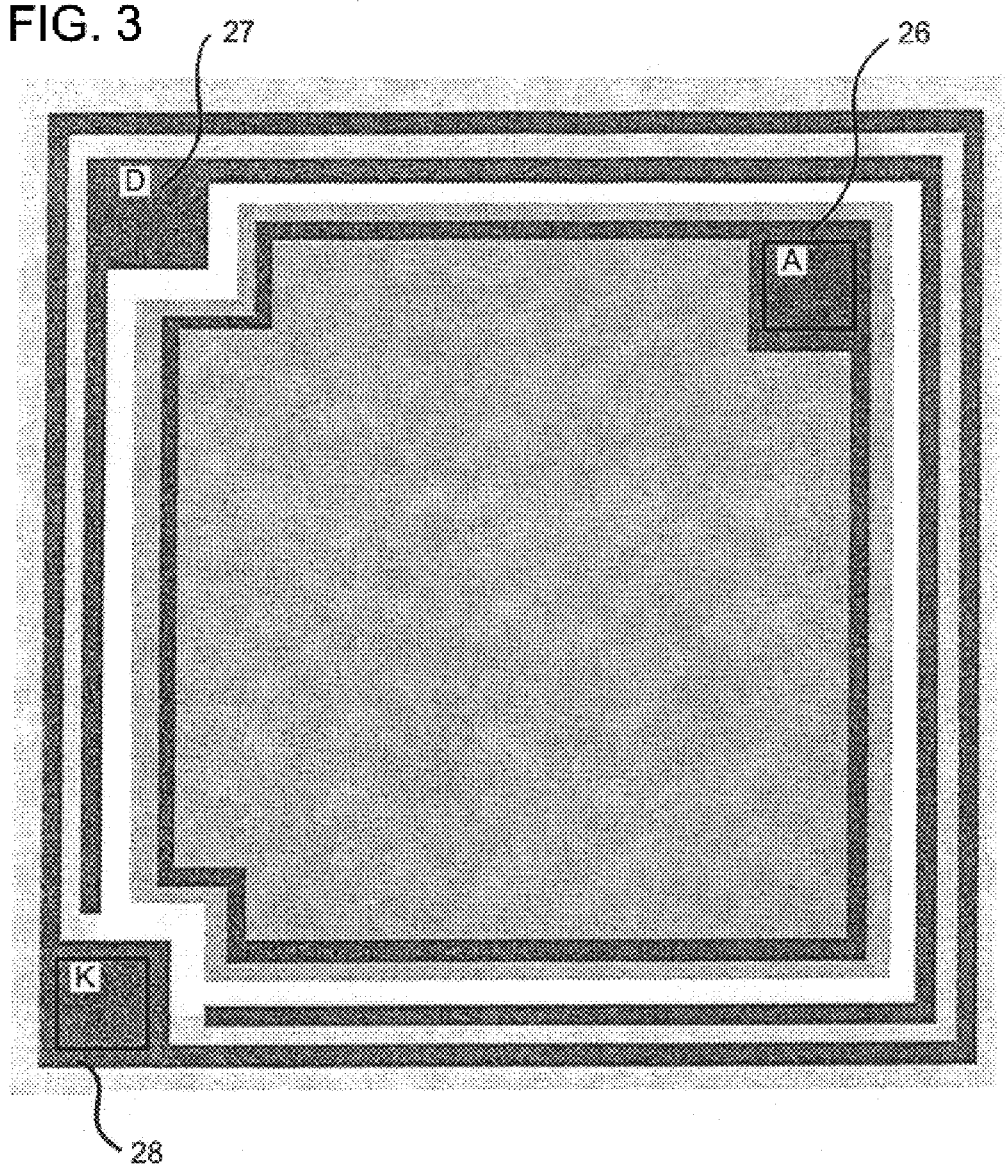
FIG. 3 is a plan view illustrating the structure of a photodiode in accordance with Embodiment 2 of the present invention.
Figure 4:
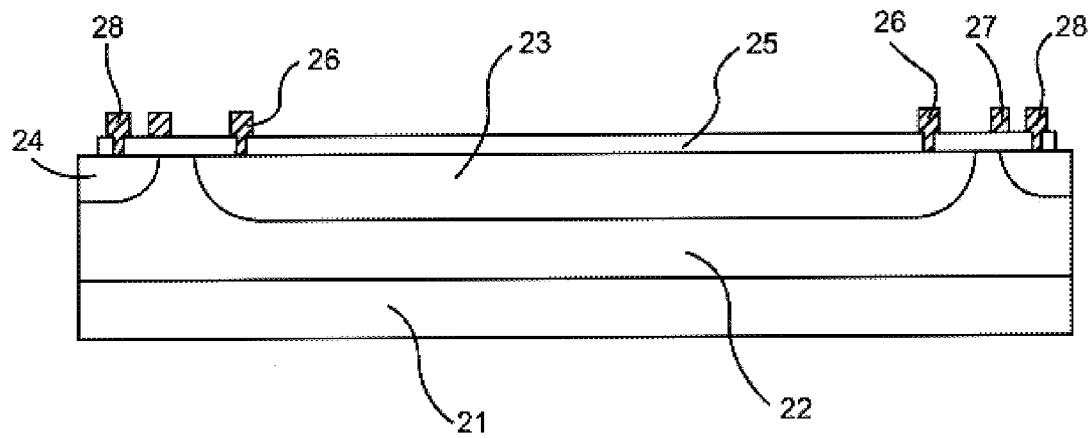
FIG. 4 is a sectional view of FIG. 3.

FIG. 3 is a plan view illustrating the structure of a photodiode in accordance with Embodiment 2 of the present invention, and FIG. 4 is a sectional view of FIG. 3.

In FIGS. 3 and 4, a photodiode P2 is provided with a high-concentration N$^+$-type substrate 21 as a high-concentration first conductivity-type substrate; a low-concentration N$^-$-type epitaxial layer 22 formed as a low-concentration first conductivity-type epitaxial layer on an upper face of the substrate 21; a P-type diffusion (boron diffusion) layer 23 formed in the epitaxial layer 22 as a second conductivity-type diffusion layer which serves as a light-receptive section; and an N-type diffusion (phosphorus diffusion) layer 24 formed as a channel stopper outside the P-type diffusion layer 23, i.e., in an inner periphery of the epitaxial layer 22. The surface of a chip (photodiode P2) of the above-described structure is covered with an oxide film 25, on which an anode 26, a dummy electrode 27 and a cathode 28 are formed of aluminum in the form of rings sequentially from inside.

As in Embodiment 1, the dummy electrode 27 is formed proximate a periphery of the chip. In particular the dummy electrode 27 is formed over a region of the epitaxial layer 22 which boarders the N-type diffusion layer 24. The dummy electrode 27 is formed in an essentially concentric manner with a perimeter of the P-type diffusion layer 23. The dummy electrode 27 is electrically insulated from the anode 26 and the cathode 28. In this embodiment, a feature of the structure of the electrodes in the periphery of the chip is that the dummy electrode 27 is sandwiched between the anode 26 and the cathode 28. Thereby the cathode 28 and the dummy electrode 27 pick up noise from all directions to the chip equally. Therefore, the photodiode P2 has more improved noise immunity than that of Embodiment 1.

Figure 5:
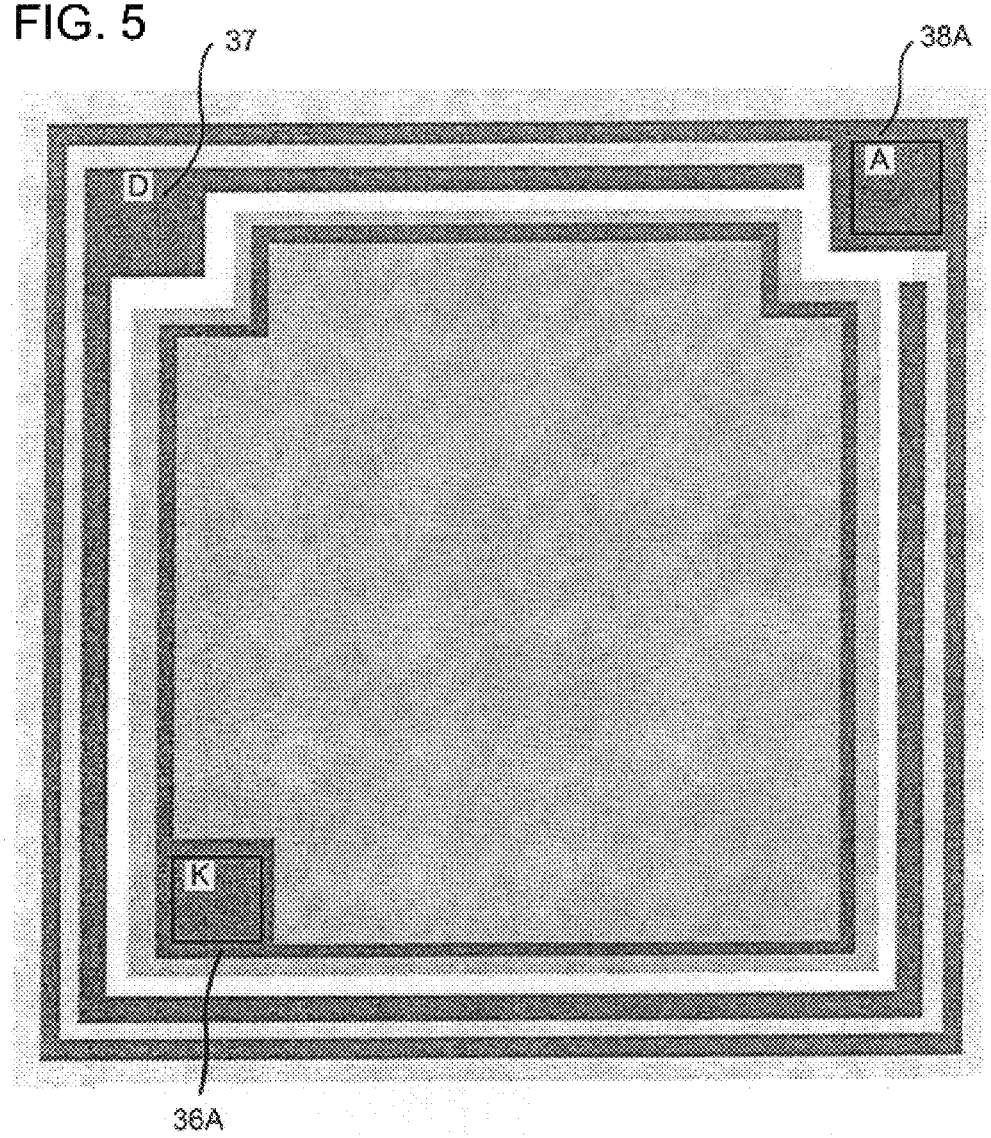
FIG. 5 is a plan view illustrating the structure of a photodiode in accordance with Embodiment 3 of the present invention.
Figure 6:
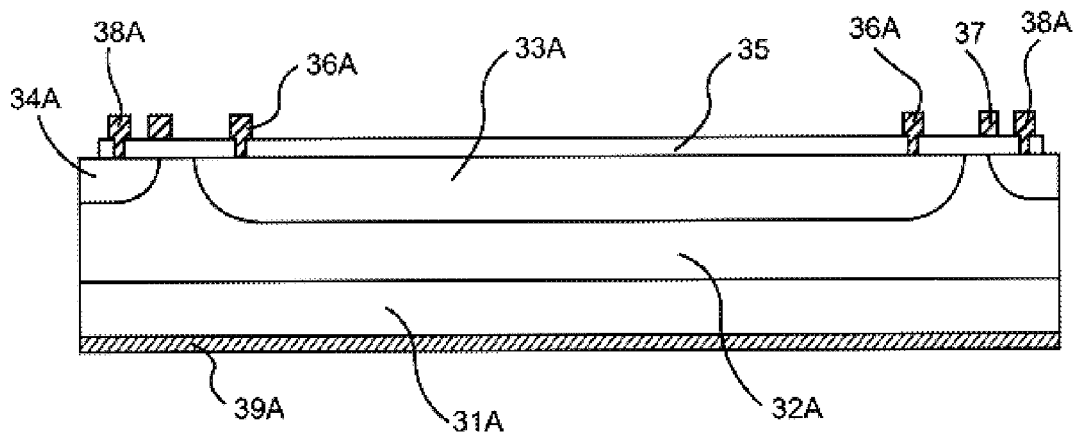
FIG. 6 is a sectional view of FIG. 5.

FIG. 5 is a plan view illustrating the structure of a photodiode in accordance with Embodiment 3 of the present invention, and FIG. 6 is a sectional view of FIG. 5.

In FIGS. 5 and 6, a photodiode P3 is provided with a high-concentration P$^+$-type substrate 31A as a high-concentration first conductivity-type substrate; a low-concentration P$^-$-type epitaxial layer 32A formed as a low-concentration first conductivity-type epitaxial layer on an upper face of the substrate 21; an N-type diffusion (phosphorus diffusion) layer 33A formed in the epitaxial layer 32A as a second conductivity-type diffusion layer which serves as a light-receptive section; and a P-type diffusion (boron diffusion) layer 34A formed as a channel stopper outside the N-type diffusion layer 33A, i.e., in an inner periphery of the epitaxial layer 32A. The surface of a chip (photodiode P3) of the above-described structure is covered with an oxide film 35, on which an anode 36A, a dummy electrode 37 and a cathode 38A are formed of aluminum in the form of rings sequentially from inside.

As in Embodiment 2, the dummy electrode 37 is formed proximate a periphery of the chip. In particular the dummy electrode 37 is formed over a region of the epitaxial layer 32 which boarders the N-type diffusion layer 34. The dummy electrode 37 is formed in an essentially concentric manner with a perimeter of the P-type diffusion layer 33. The dummy electrode 37 is electrically insulated from the anode 26 and the cathode 38. The dummy electrode 37 is sandwiched between the anode 36A and the cathode 38A. Thus this embodiment can have the same effect as Embodiment 2.

The substrate 31A is of P type, but the same effect can be obtained as in the case of an N-type substrate. However, if the concentration in the epitaxial layer is the same, the N-type substrate has a longer lifetime and therefore has a larger photoelectric current. Further, with the N-type substrate, the epitaxial layer can have a grounded potential at its upper part. The N-type substrate is more effective in improvement of the noise immunity.

Embodiment 4

Figure 7:
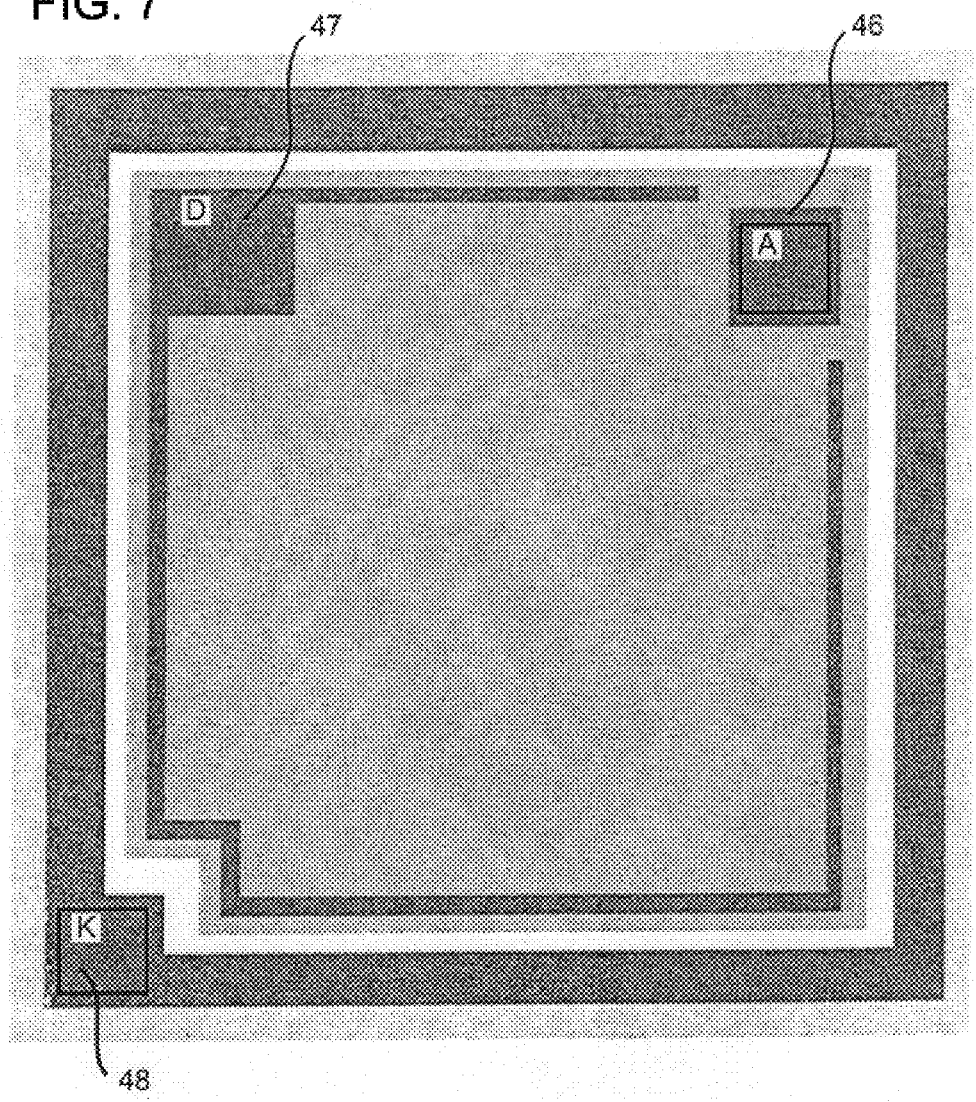
FIG. 7 is a plan view illustrating the structure of a photodiode in accordance with Embodiment 4 of the present invention.
Figure 8:
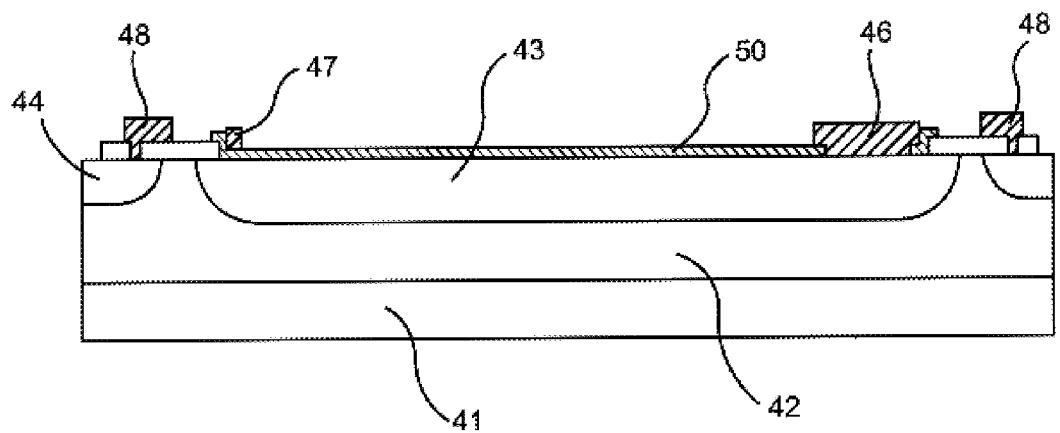
FIG. 8 is a sectional view of FIG. 7.

FIG. 7 is a plan view illustrating the structure of a photodiode in accordance with Embodiment 4 of the present invention, and FIG. 8 is a sectional view of FIG. 7.

In FIGS. 7 and 8, a photodiode P4 is provided with a high-concentration $N^+$-type substrate 41 as a high-concentration first conductivity-type substrate; a low-concentration $N^-$-type epitaxial layer 42 formed as a low-concentration first conductivity-type epitaxial layer on an upper face of the substrate 41; a P-type diffusion (boron diffusion) layer 23 formed in the epitaxial layer 42 as a second conductivity-type diffusion layer which serves as a light-receptive section; and an N-type diffusion (phosphorus diffusion) layer 44 formed as a channel stopper outside the P-type diffusion layer 43, i.e., in an inner periphery of the epitaxial layer 42.

On the surface of a chip (photodiode P4) of the above-described structure, 15 formed an oxide film 45, which is then removed from the chip except at the periphery of the chip. On the P-type diffusion layer 43 exposed by the removal of the oxide film 45, a nitride film 50 is formed by low pressure chemical vapor deposition (LPCVD).

On the nitride film 50, an anode 46 and a dummy electrode 47 are formed of aluminum. A cathode 48 is formed on the oxide film 45 remaining in the periphery of the chip, following the shape of the oxide film 45.

The nitride film, as generally known as an antireflective film, can reduce the reflectivity of the surface of the chip and raise the sensitivity to light of the light-receptive section. Also the thickness of the nitride film can be controllably produced within 80 to 100 nm, and therefore, variations in the photoelectric current can be reduced.

By forming the dummy electrode 47 on the nitride film, capacitance by the nitride film can be obtained. Junction capacitance can form between the anode 46 and the cathode 48, but, with the constructions of the FIGS. 1 to 6, since the dummy electrode is formed on the oxide film, the capacitance between the anode and the dummy electrode is smaller than the above junction capacitance. If the light-receptive area is increased for lengthening the communication distance, the junction capacitance also increases. Therefore, noise between the anode and the cathode also increases and loses balance with noise between the anode and the dummy electrode. Consequently, the noise immunity declines.

In contrast, the nitride film 50 has a larger insulation resistance and a larger dielectric constant and can be formed thinner than an oxide film. Therefore the capacitance formed by the nitride film 50 can be increased and can be almost the same as the junction capacitance. Thus by balancing the capacitance between the dummy electrode 47 and the anode 46 with the junction capacitance between the anode electrode 46 and the cathode electrode 47, the amplitude of noise can be balanced, and therefore, can be cancelled by the differential amplifier.

Figure 13:
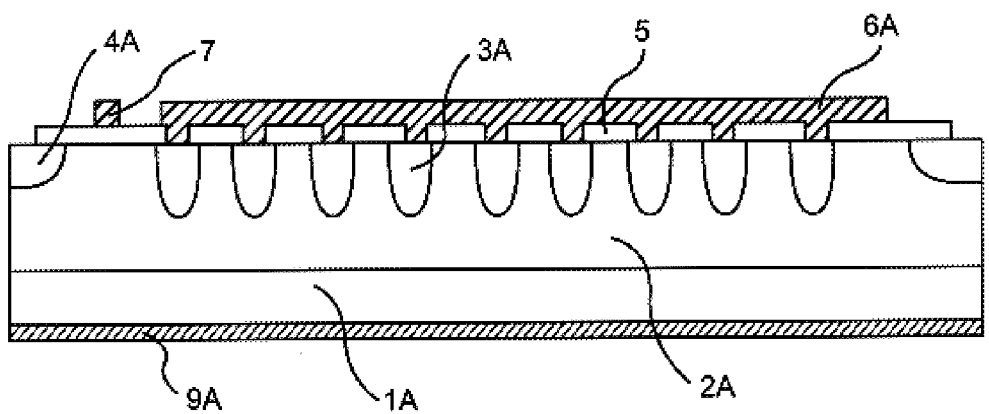
FIG. 13 shows the prior-art photodiode of FIG. 12, corresponding to FIG. 2.

As discussed above, according to the present invention, the periphery of the chip is covered with a metal electrically insulated from the anode and the cathode for shading. Also the metal and the cathode are wire-bonded as shown in FIG. 13, and two signals are amplified by the differential amplifier so that noise is cancelled and only the signals are taken out. The photoelectric current is not generated in the periphery of the chip, and therefore, the response speed can be prevented from dropping. The comb-form wiring, which has been adopted for prior-art photodiodes with improved noise immunity, is not used in the present invention. Therefore, the light-receptive section is not covered with metal and signal components do not weaken. The cathode and the dummy electrode are in parallel in the periphery of the chip, and noise from all directions can be picked up equally. Two signals from the cathode and the dummy electrode are input to the differential amplifier which in turn cancels the noise. Thus the noise immunity of the photodiode can be improved.

According to the present invention, the third electrode (dummy electrode) is provided proximate the periphery of the photodiode. Therefore, it is possible to provide a high-speed photodiode with good noise immunity which does not mis-operate in communications between a wide range of distance.

What is claimed is:

1. A photodiode comprising:
    a high-concentration first conductivity-type substrate;
    a low-concentration first conductivity-type epitaxial layer formed on one face of the substrate;
    a second conductivity-type diffusion layer formed in the epitaxial layer, the diffusion layer serving as a light-receptive section;
    a pair of electrodes comprising a cathode and an anode, one of the pair of electrodes being mounted on the second conductivity-type diffusion layer and the other being mounted on another face of the substrate or one of the pair of electrodes being mounted on the second conductivity-type diffusion layer and the other being mounted on the epitaxial layer except the diffusion layer; and
    a third electrode covering an outer periphery or an inner periphery of a region on four sides to pick up noise from all directions to the photodiode, the region being occupied by the second conductivity-type diffusion layer on the epitaxial layer, the third electrode not contacting the pair of electrodes.

2. A photodiode according to claim 1, wherein the anode is provided within the region occupied by the second conductivity-type diffusion layer and along an inward side of the third electrode.

3. A photodiode according to claim 1, wherein the anode is provided within the region occupied by the second conductivity-type diffusion layer along an inward side of the third electrode, and the cathode is provided on the epitaxial layer along an outward side of the third electrode.

4. A photodiode according to claim 3, further comprising another substrate which is die-bonded insulatively to the high-concentration first conductivity-type substrate and has a grounded potential, and a pair of signal lines extending from the cathode and the third electrode, wherein the anode is connected to said another substrate.

5. A photodiode according to claim 4, wherein the area of the third electrode is so set that capacitance produced by the third electrode, the P-type diffusion layer and the silicon nitride layer therebetween is equal to the sum of capacitance between the anode and the cathode and capacitance produced by the substrate, said another substrate and an insulative layer therebetween.

6. A photodiode according to claim 3, further comprising a differential amplifier, the third electrode and the cathode being connected by signal lines to the differential amplifier to provide noise immunity for the photodiode.

7. A photodiode according to claim 1, wherein the cathode is provided within the region occupied by the second conductivity-type diffusion layer along an inward side of the third electrode, and the anode is provided on the epitaxial layer along an outward side of the third electrode.

8. A photodiode according to claims 1 to 7, further comprising a silicon nitride layer on the second conductivity-type diffusion layer, wherein the third electrode is mounted on the silicon nitride layer and the second conductivity-type diffusion layer is a P-type diffusion layer.

9. A photodiode according to claims 1 to 8, further comprising another substrate which is die-bonded insulatively to the high-concentration first conductivity-type substrate and has a grounded potential, and a pair of signal lines extending from the cathode and the third electrode, wherein the anode is connected to said another substrate.

10. A photodiode according to claim 9, wherein the area of the third electrode is so set that capacitance produced by the third electrode, the P-type diffusion layer and the silicon nitride layer therebetween is equal to the sum of capacitance between the anode and the cathode and capacitance produced by the said another substrate and an insulative layer therebetween.

11. A photodiode according to claim 9, wherein the anode is provided within the region occupied by the second conductivity-type diffusion layer and along an inward side of the third electrode.

12. A photodiode according to claim 9, further comprising a silicon nitride layer on the second conductivity-type diffusion layer, wherein the third electrode is mounted on the silicon nitride layer and the second conductivity-type diffusion layer is a P-type diffusion layer.

13. A photodiode according to claim 9, further comprising a differential amplifier, the third electrode and the cathode being connected by signal lines to the differential amplifier to provide noise immunity for the photodiode.

* * * * *